US009305833B2

(12) United States Patent
Hu

(10) Patent No.: US 9,305,833 B2
(45) Date of Patent: Apr. 5, 2016

(54) SEMICONDUCTOR STRUCTURES AND FABRICATION METHOD THEREOF

(71) Applicant: Semiconductor Manufacturing International (Shanghai) Corporation, Shanghai (CN)

(72) Inventor: Chunzhou Hu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/324,403

(22) Filed: Jul. 7, 2014

(65) Prior Publication Data

US 2015/0054156 A1 Feb. 26, 2015

(30) Foreign Application Priority Data

Aug. 20, 2013 (CN) .......................... 2013 1 0365795

(51) Int. Cl.
*H01L 21/44* (2006.01)
*H01L 21/469* (2006.01)
*H01L 21/31* (2006.01)
*H01L 21/768* (2006.01)
*H01L 21/02* (2006.01)
*H01L 21/321* (2006.01)

(52) U.S. Cl.
CPC .... *H01L 21/76814* (2013.01); *H01L 21/02063* (2013.01); *H01L 21/321* (2013.01); *H01L 2924/0002* (2013.01)

(58) Field of Classification Search
CPC ............... H01L 21/283; H01L 21/321; H01L 21/02063; H01L 21/02205; H01L 21/76814
USPC ......... 438/653, 675, 745, 754, 756, 765, 789, 438/906; 257/741, 758, 773, E21.251, 257/E21.257, E21.492, E21.579, E23.142, 257/E23.145
See application file for complete search history.

(56) References Cited

U.S. PATENT DOCUMENTS 7,122,484 B2 * 10/2006 Perng et al. ................... 438/765
2006/0183348 A1 * 8/2006 Meagley et al. ............. 438/789
2007/0232064 A1 * 10/2007 Oh et al. ....................... 438/675

* cited by examiner

*Primary Examiner* — Dao H Nguyen
(74) *Attorney, Agent, or Firm* — Anova Law Group, PLLC

(57) ABSTRACT

A method is provided for fabricating a semiconductor structure. The method includes providing a substrate; and forming a conductive layer in one surface of the substrate. The method also includes forming a dielectric layer on the surface of the substrate; and forming an opening exposing a portion of the conductive layer in the dielectric layer. Further, the method includes forming a passivation layer for protecting the portion of the conductive layer on a surface of the portion of the conductive layer on the bottom of the opening using a passivation solution; and cleaning inner surface of the opening using a cleaning solution not reacting with the passivation layer. Further, the method also includes removing the passivation layer; and forming a metal layer connecting with the conductive layer in the opening.

20 Claims, 4 Drawing Sheets

SEMICONDUCTOR STRUCTURES AND FABRICATION METHOD THEREOF

CROSS-REFERENCES TO RELATED APPLICATIONS

This application claims the priority of Chinese patent application No. 201310365795.1, filed on Aug. 20, 2013, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

With the development of semiconductor technology, the integration level of the ultra-large-scale integration (ULSI) has reached a scale of hundreds of millions to billions devices on one chip, and two or more layers of metal interconnections have been widely applied. The conventional interconnections are made of aluminum. However, with the continuous shrinkage of the critical dimension of the semiconductor devices in integrated circuits, the circuit density of metal interconnections has been continuously increased; and the required response time has been continuously decreased, thus the conventional aluminum metal interconnections are unable to match the requirements of the development of ULSI. After the technology node becomes lower than 130 nm, copper interconnections have replaced the aluminum interconnections. Comparing with the aluminum interconnections, the lower resistivity of copper can lower the resistance-capacitance (RC) delay of the interconnection lines, thus the electro migration may be improved; and the stability of the devices may be improved. The state-of-art method for forming the copper metal interconnections is the embedding technology of the Damascene process.

The embedding technology of the Damascene process includes forming trenches and/or through holes in a low-K dielectric layer by an etching process; followed by filling the trenches and/or through holes using interconnection materials, such as copper, etc. The metals in the through holes of different low-K dielectric layers connect to each other, thus the copper interconnections are achieved.

In the above-mentioned process, after forming the trenches and/or the through holes, it may need to clean the surfaces of the trenches and/or the through holes to remove the residues of the etching process after etching the low-K dielectric layers. However, the metal interconnection materials under the through holes may be damaged and/or lost, thus the interconnection properties of subsequently formed interconnection structures may be affected. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a substrate; and forming a conductive layer in a surface of the substrate. The method also includes forming a dielectric layer on the surface of the substrate covering the conductive layer; and forming an opening exposing a portion of the conductive layer in the dielectric layer. Further, the method includes forming a passivation layer for protecting the portion of the conductive layer on a surface of the portion of the conductive layer on the bottom of the opening using a passivation solution; and cleaning inner surface of the opening using a cleaning solution not reacting with the passivation layer. Further, the method also includes removing the passivation layer; and forming a metal layer connecting with the conductive layer in the opening.

Another aspect of the present disclosure includes a semiconductor structure. The semiconductor structure includes a substrate; and a conductive layer formed in a surface of the substrate. The semiconductor structure also includes a dielectric layer formed on the surface of the substrate covering the conductive layer; and a metal layer connecting with the conductive layer formed in the dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As mentioned above, during the existing fabrication process of the interconnection structures, the cleaning process may often cause losing of the metal interconnection material under the through holes, thus the interconnection properties of the subsequently formed metal material in the through holes and the interconnection material under the through holes may be affected.

Specifically, after etching the low-K dielectric layer and forming the trenches and the through holes, polymer residues may be left on the inner surfaces of the trenches and the through holes and the surfaces of the low-K dielectric layer and the mask layer. The polymer residues may include photoresist, anti-reflection material, and polymers formed by the etching gas and the low-K dielectric layer, etc. The polymer residues may need to be removed before further fabrication steps. The polymer residues may be cleaned by a solution process. However, the solution process may etch the metal interconnection material under the through holes; and the interconnection materials may be lost after the cleaning process. The material lost may cause dents and/or defects to be formed on the surface of the interconnection material under the through holes. After forming a top metal material in the through holes, the top metal material and the bottom metal material (the interconnection material under the through holes) may have a loose bonding. The loose bonding of the top metal material and the bottom metal material may cause open circuit problems, thus the interconnection properties of the obtained interconnection structure may be affected; and the performance of the whole IC chip having the interconnection structure may be affected. According to the disclosed embodiments, the material-lose issue may be overcome by forming a passivation layer on the metal interconnection material under the through holes.

Figure 6:
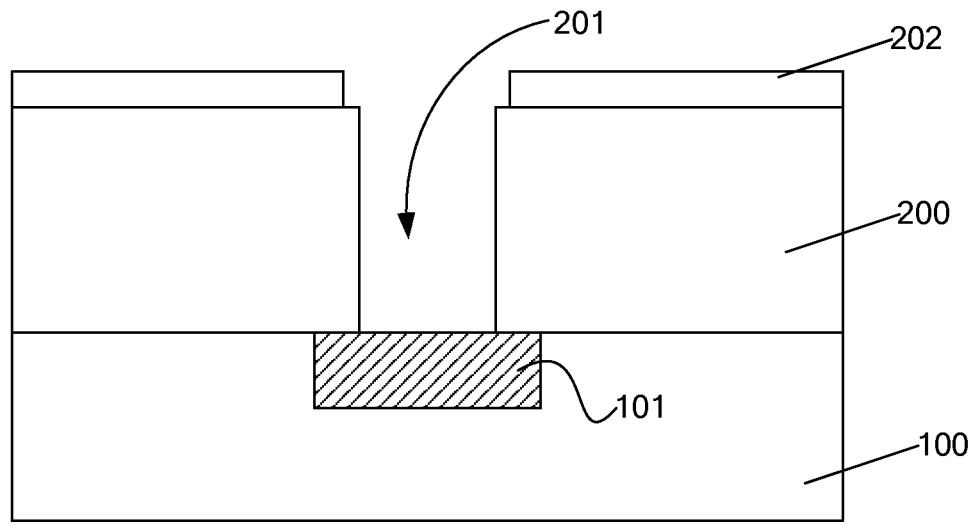
Figure 7:
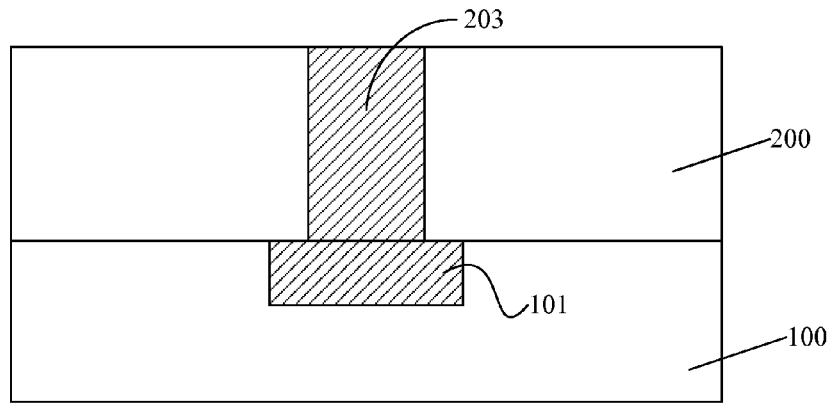
Figure 8:
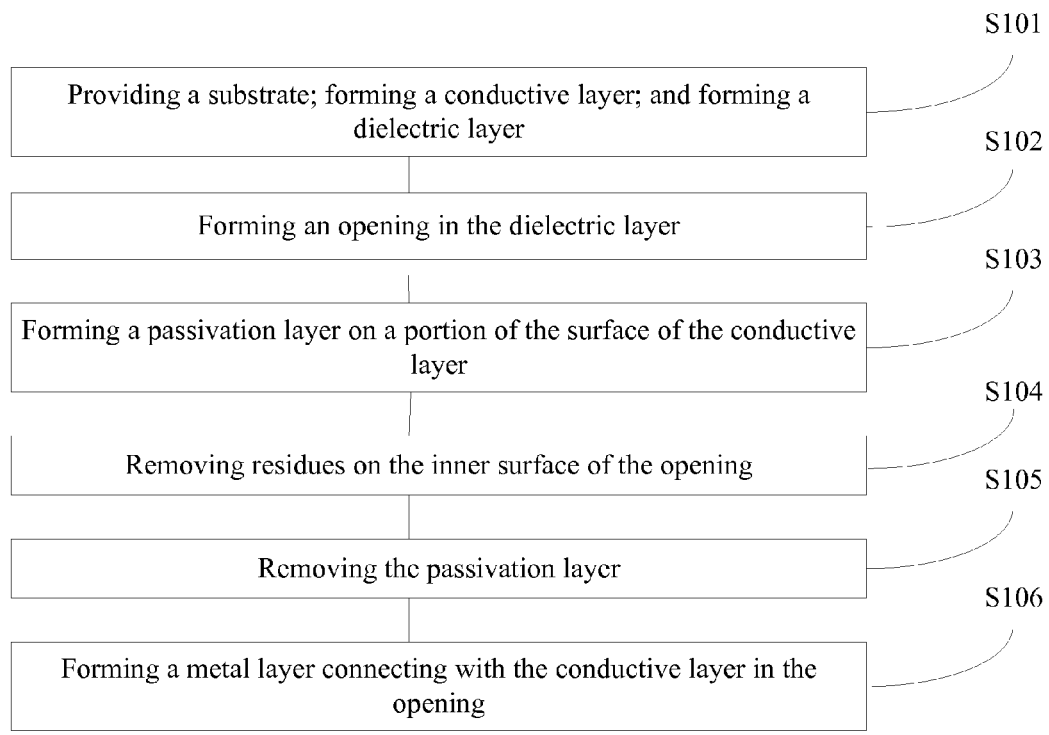
FIG. 8 illustrates an exemplary fabrication process of a semiconductor structure consistent with the disclosed embodiments.

FIG. 8 illustrates an exemplary fabrication process of a semiconductor structure; and FIG. 1~3 and FIGS. 5~7 illustrate exemplary semiconductor structures corresponding to various stages of the fabrication process.

Figure 1:
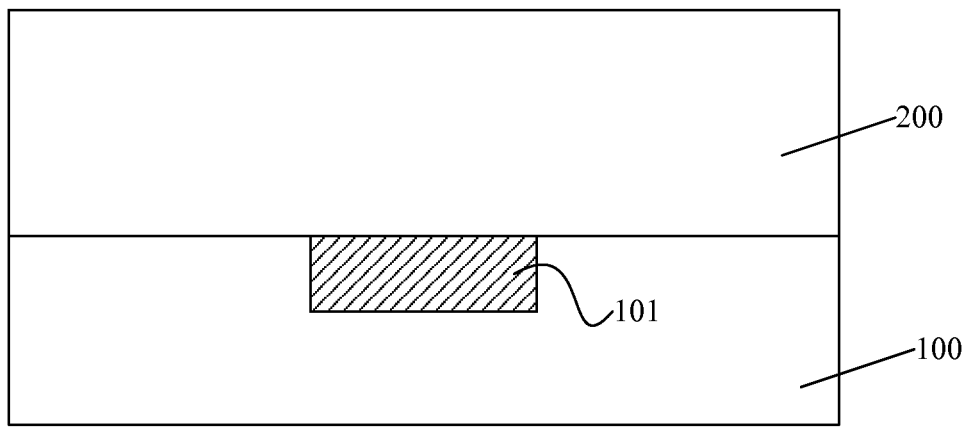
FIGS. 1~3 illustrate semiconductor structures corresponding to certain stages of an exemplary fabrication process of a semiconductor structure consistent with the disclosed embodiments.

As shown in FIG. 8, at the beginning of the fabrication process, a substrate with certain structures is provided (S101). FIG. 1 illustrates a corresponding semiconductor structure.

As shown in FIG. 1, a substrate 100 is provided. A conductive layer 101 is formed in one surface of the substrate 100; and a dielectric layer 200 is formed on the surface of the conductive layer 101 and the surface of the substrate 100.

The substrate 100 may be a semiconductor substrate, such as silicon, silicon on insulator (SOI), germanium on insulator (GOI), silicon germanium, carborundum, indium antimonide, lead telluride, indium arsenide, indium phosphide, gallium arsenidie, gallium antimonite, alloy semiconductor, or glass etc. The semiconductor substrate 100 provides a base for subsequent processes and structures. Semiconductor devices or other structures may be formed in the semiconductor substrate 100.

The substrate 100 may also be a dielectric material layer formed on another substrate (not shown). Interconnection structures, such as conductive vias, or wires, etc., may be formed in the dielectric material layer.

In one embodiment, the substrate 100 is a dielectric material layer. The conductive layer 101 may be formed in the substrate 100. The conductive layer 101 may be interconnection wires formed in the substrate 100. The conductive layer 101 may also be metal via structures penetrating through the substrate 100.

The conductive layer 101 may be made of any appropriate material, such as copper, aluminum, or metal alloy, etc. In one embodiment, the conductive layer 101 is made of copper. The conductive layer 101 may be formed by any appropriate process.

The dielectric layer 200 may be made of any appropriate material, such as low dielectric constant material (low-K) material, etc. The low-K material may include one or more of silicon carbide, silicon oxynitride, organic siloxane polymers, or fluorocarbon compounds, etc. Openings may be subsequently formed in the dielectric layer 200; and the openings may be filled with metal materials. The metal materials may connect with the conductive layer 101 to form interconnection structures. In one embodiment, the dielectric layer 200 is made of silicon nitride.

The dielectric material layer 200 may be formed by any appropriate process, such as a chemical vapor deposition (CVD) process, a physical vapor deposition (PVD) process, an atomic layer deposition (ALD) process, a flowable chemical vapor deposition (FCVD) process, a spin-coating process, or a sputtering process, etc.

In certain other embodiments, the dielectric layer 200 may also include an etching barrier layer (not shown) between the substrate 100 and the low-K dielectric material. The etching barrier layer may be used to prevent the semiconductor devices and the interconnection structures from being affected by subsequent processes. Further, the etching barrier layer may be used as an etching stop layer for subsequently forming the openings in the low-K dielectric material layer; and may prevent the metal of the subsequently formed interconnection structures from diffusing downwardly.

The etching barrier layer may be made of any appropriate material, such as SiN, SiCN, or SiONCH, etc. The thickness of the etching barrier layer may be in a range of approximately 100 Å~500 Å. Various processes may be used to form the etching barrier layer, such as a CVD process, a PVD process, or an FCVD process, etc.

Figure 2:
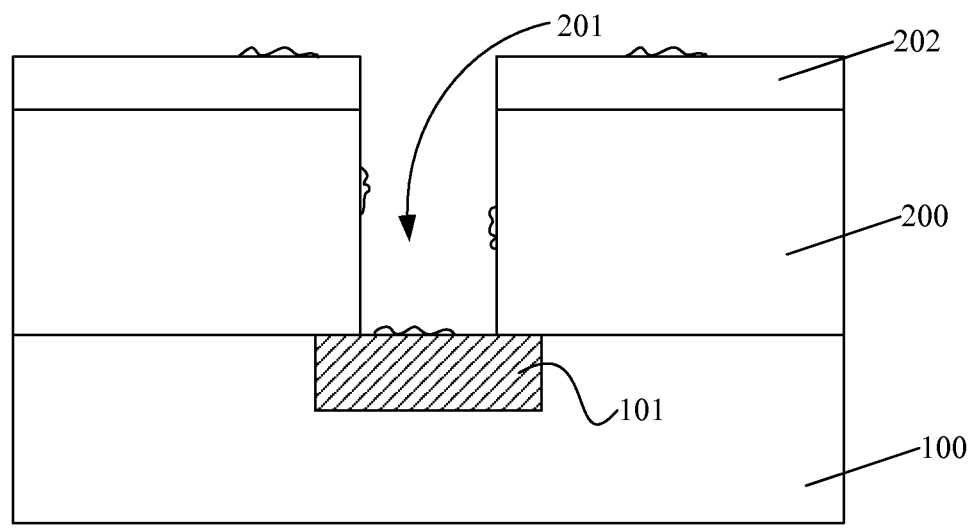

Returning to FIG. 8, after providing the semiconductor substrate 100 and forming the dielectric layer 200, an opening may be formed (S102). FIG. 2 illustrates a corresponding semiconductor structure.

As shown in FIG. 2, an opening 201 is formed in the dielectric layer 200. The opening 201 may expose a portion of the conductive layer 101.

A process for forming the opening 201 may include forming a hard mask layer 202 on the dielectric layer 200; forming a photoresist layer (not shown) on the hard mask layer 202 by using, for example, a spin-coating process; patterning the photoresist layer by exposing and developing the photoresist layer; etching the hard mask layer 202 using the patterned photoresist layer as an etching mask; and etching the dielectric layer 200 until the surface of the conductive layer 101 is exposed using the etched hard mask layer 202 as an etching mask. Thus, the opening 201 may be formed in the dielectric layer 200 on the portion of the surface of the conductive layer 101.

The hard mask layer 202 may be made of any appropriate material, such as $SiO_2$, SiN, SiON, TiN, or TaN, etc. In one embodiment, the hard mask layer 202 is made of TiN.

In certain other embodiments, the hard mask layer 202 may be omitted; and the photoresist layer may be directly used as an etching mask to etch the dielectric layer 200 to form the opening 201.

In certain other embodiments, the opening 201 may be formed by a double embedding process. Specifically, a through hole may be formed in the dielectric layer 200 firstly; and then a bottom antireflection layer may be formed to fill the through hole and cover the surface of the bottom antireflection layer. Further, a mask layer may be formed on the surface of the bottom antireflection layer; and then the portion of the bottom reflection layer in the through hole may be removed using the mask layer as an etching mask. Further, a trench may be formed on the through hole by etching the dielectric layer 200; and the through hole and the trench on the through hole may be configured as the opening 201. Wherein the size of trench may be greater than the through hole.

Various processes may be used to etch the dielectric layer 200 to form the opening 201, such as a dry etching process, a wet etching process, or an ion beam etching process, etc. In one embodiment, the dielectric layer 206 is etched by a dry etching process to form the opening 201. The etching gas of the dry etching process may include one or more of $CF_4$, $CHF_3$, $CH_2F_2$, and $C_2F_6$, etc. The etching gas may form polymers on the etched surface during the dry etching process, thus the lateral etching rate may be reduced. Therefore, the perpendicularity of the side surface of the opening 201 may be improved.

After forming the opening 201, polymer residues (not labeled) may be left on the inner surface of the opening 201 and the surface of the hard mask layer 202. The polymer residues may include residues of the photoresist layer and the bottom antireflection layer, and the polymers formed by the reaction of the etching gas and the dielectric layer 200, etc.

In one embodiment, the residual polymers on the hard mask layer 202 may contain a large quantity of Ti. The residual polymers on the side surface of the opening 201 may contain a large quantity of Si and C. The residual polymers on the surface of the conductive layer 101 on the bottom of the opening 201 may contain a large quantity of Cu.

The residual polymers may affect the flatness of the inner surface of the opening 201 and the filling quality of the metal layer subsequently formed in the opening 201. Further, the residual polymers may affect the conductivity of the metal material; and may cause a plurality of problems, such as the yield of IC chips, etc. Thus, it may need a subsequent cleaning process to remove the residual polymers.

Figure 3:
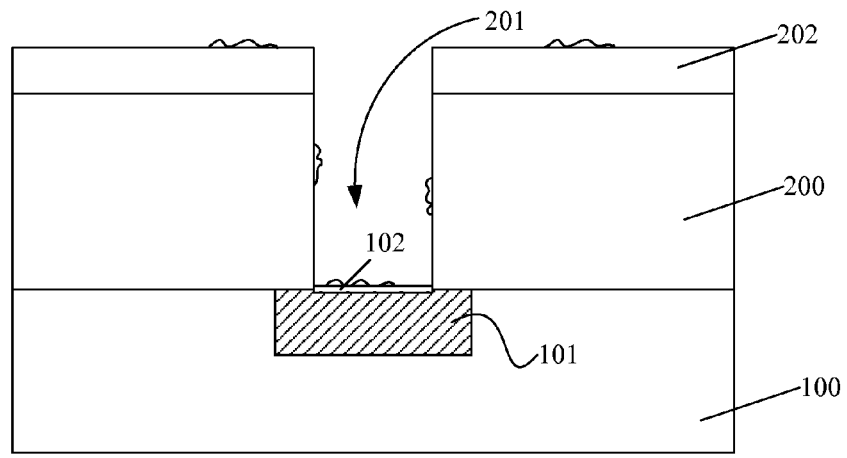

Returning to FIG. 8, after forming the opening the opening 201, a passivation layer may be formed (S103). FIG. 3 illustrates a corresponding semiconductor structure.

As shown in FIG. 3, a passivation layer 102 is formed on the surface of the conductive layer 101 on the bottom of the opening 201. The passivation layer 102 may be formed by passivating the surface of the conductive layer 101 exposed by the opening 201 using appropriate passivation solutions.

Various chemicals may be used as the passivation solution, such as a 1,2,3-benzotriazole (BTAH) water solution, a water solution of the derivative of 1,2,3-benzotriazole, or a water solution of 1,2,3-benzotriazole and the derivative of 1,2,3-benzotriazole, etc. The concentration of 1,2,3-benzotriazole in the 1,2,3-benzotriazole water solution may be in a range of approximately 10 ppm~1000 ppm. The concentration of the derivative of 1,2,3-benzotriazole in the water solution of the derivative of 1,2,3-benzotriazole may be in a range of approximately 10 ppm~1000 ppm. The total concentration of 1,2,3-benzotriazole and the derivative of 1,2,3-benzotriazole in the water solution of 1,2,3-benzotriazole and the derivative of 1,2,3-benzotriazole may be in a range of approximately 10 ppm~1000 ppm. The 1,2,3-benzotriazole derivative may include at least one of 4-methylbenzotriazole, 5-methylbenzotriazole, 5-chlorobenzotriazole, or 5-nitrobenzotriazole, etc.

The passivation layer 102 may be formed by dipping the substrate 100 with conductive layer 101 exposed by the opening 201 into the passivation solution for approximately 30 s~120 s. Such a time frame may ensure the passivation solution to fully react with surface of the conductive layer 101 exposed by the opening 201 to form the passivation layer 102. The thickness of the passivation layer 102 may be smaller than approximately 10 nm. Such a thickness may not only adequately protect the conductive layer 101, but also is easy to be subsequently removed.

The passivation solution may react with the material of the conductive layer 101; and a metal complex may be formed on the surface of the conductive layer 101. The metal complex layer may passivate the surface of the conductive layer 101. That is, the passviation layer 102 (the metal complex layer) may not react with the cleaning solution of the subsequent cleaning process. Thus, the passivation layer 102 may prevent the conductive layer 101 from being damaged by the sequent cleaning process for removing the polymer residues.

Figure 4:
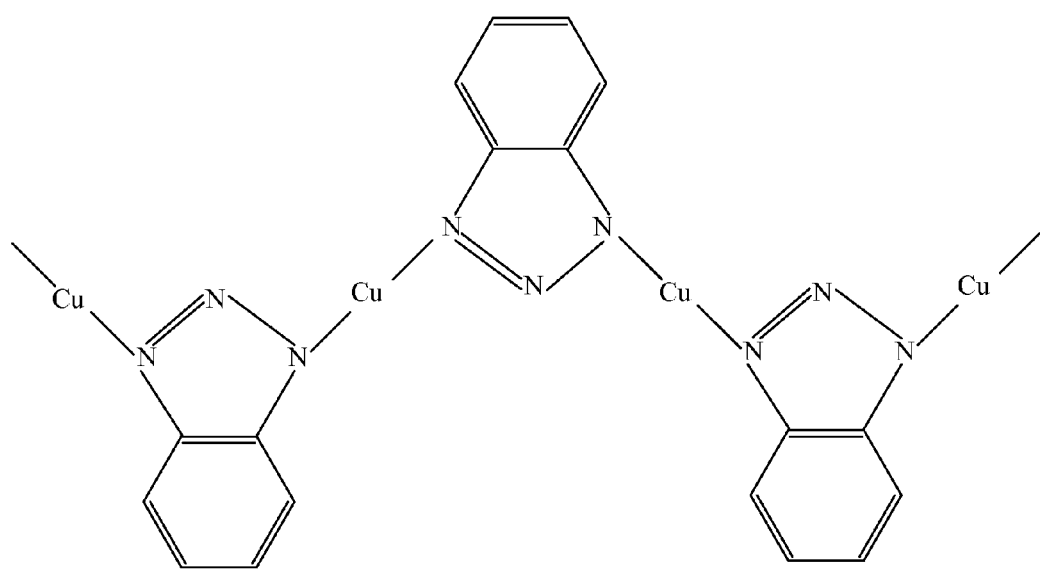
FIG. 4 illustrates the molecular structure of the material of a passivation layer consistent with the disclosed embodiment.

In one embodiment, the conductive layer 101 is made of Cu (copper), the 1,2,3-benzotriazole water solution may be used to form the passivation layer 102; and may be referred as a Cu inhibitor solution. The concentration of 1,2,3-benzotriazole in the 1,2,3-benzotriazole water solution may be in a range of approximately 10 pp~1000 ppm, such as 20 ppm, 100 ppm, 500 ppm, or 700 ppm, etc. Cu of the conductive layer 101 may react with the 1,2,3-benzotriazole in the 1,2,3-benzotriazole water solution; and Cu complex may be formed. The Cu complex may form a dense passivation layer 102 on the surface of the conducive layer 101 exposed by the opening 201. The copper complex may be Cu-benzotriazole. The molecular structure of Cu-benzotriazole is illustrate in FIG. 4. The passivation layer 102 may protect the conductive layer 101 in the subsequent cleaning process.

Figure 5:
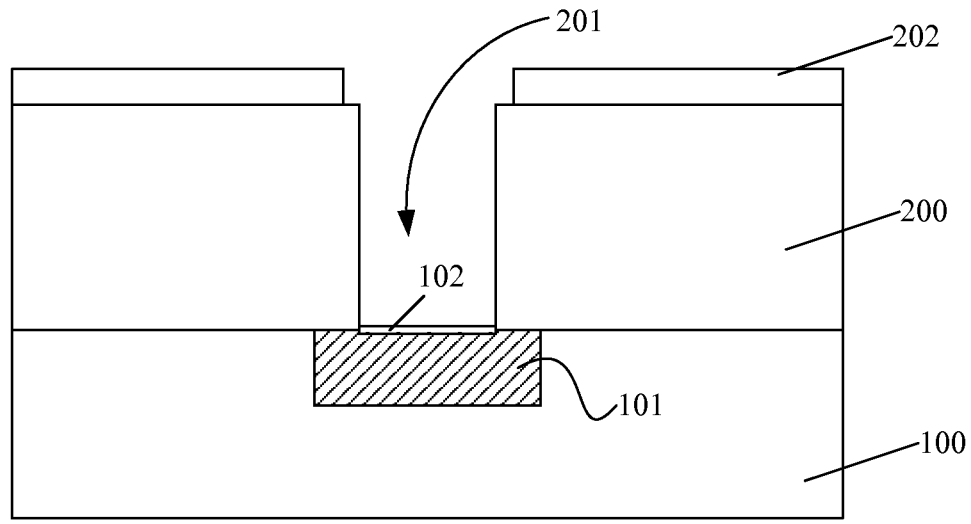
FIGS. 5~7 illustrate semiconductor structures corresponding to certain stages of an exemplary fabrication process of a semiconductor structure consistent with the disclosed embodiments.

Returning to FIG. 8, after forming the passivation layer 102, the polymer residues on the inner surface of the opening 201 may be removed (S104). FIG. 5 illustrates a corresponding semiconductor structure.

As shown in FIG. 5, the polymer residues on the inner surface of the opening 201 are removed by a cleaning process using appropriate cleaning solutions.

The cleaning solutions may include any appropriate chemicals, such as a mixture of amine derivatives and heterocyclic compounds, etc. In one embodiment, the cleaning solution is EKC575 or EKC580. That is, the cleaning solutions are made by EKC Technology with a model number of EKC 575 or a model number of EKC580. The EKC575 or EKC580 cleaning solution may be able to remove the large quantity of Si and C polymer residues on the inner surface of the opening 201.

Further, the surface of the hard mask layer 202 may have Ti-contained polymer residues; and the bottom of the openings 201 may have Cu-contained polymer residue, it may be difficult to remove the metal-contained polymer residues by only using the EKC575 or the EKC580. Thus oxidizing solutions (may be referred as a second cleaning solution) may be added into the EKC575 and the EKC580 to enhance the ability of the cleaning solution for removing the Ti-contained and/or Cu-contained polymer residues.

In one embodiment, a $H_2O_2$ solution with an appropriate concentration may be added into the EKC575 and the EKC580. The concentration of $H_2O_2$ may be approximately 30%. The volume ration of the $H_2O_2$ solution to the EKC575 or the EKC580 may be in a range of approximately 1:1~1:10.

Further, the mixture solution of the EKC575 or the EKC580 and the $H_2O_2$ may etch the hard mask layer 202, the thickness of the hard mask layer 202 may be reduced; and the pattern size in the hard mask layer 202 may also be increased. Therefore, the filling window for subsequently filling metal material may be increased; the difficulty for filling metal material into the opening 201 may be reduced; and the voids affecting the interconnection results formed in the metal layer filled in the opening 201 may avoided.

Because the passivation layer 102 may be formed on the conductive layer 101, when the cleaning solution is used to remove the polymer residues, the passivation layer 102 may not react with the cleaning solution. Thus, the conductive layer 101 may be protected, and the metal material of the conductive layer 101 may not be etched. Therefore, the metal lost issue may be overcome.

In certain other embodiments, other brands or other appropriate cleaning solutions may also be used to remove the polymer residues.

Returning to FIG. 8, after removing the polymer residues, the passivation layer 102 may be removed (S105). FIG. 6 illustrates a corresponding semiconductor structure.

As shown in FIG. 6, the passivation layer 102 is removed. The passivation layer 102 may be removed by any appropriate process, such as a thermal annealing process, etc. The thermal annealing process may be a low temperature thermal annealing process. The environment gas of the thermal annealing process may be one or more of $N_2$ or $H_2$, etc. The thermal annealing temperature may be in a range of approximately 200° C.~400° C. The thermal annealing time may be in a range of approximately 30 min~1 hour.

During the thermal annealing process, the passivation layer 102 may be decomposed into a metal and volatile gases, the passivation layer 102 may be removed. Thus, the interconnection properties between the subsequently formed metal material in the opening 201 and the conductive layer 101 may not be affected. Further, the thermal annealing process for removing the passivation layer 102 may be relatively simple, and it may be easy to perform.

Further, when the passivation layer 102 is removed, the residual water moisture may be dried simultaneously, thus it may unnecessarily need an extra process to dry the substrate 100.

Returning to FIG. 8, after removing the passivation layer 102, a metal layer may be formed in the opening 201 (S106). FIG. 7 illustrates a corresponding semiconductor structure.

As shown in FIG. 7, a metal layer 203 is formed in the opening 201. The metal layer 201 may fill up the opening 201. Further, the metal layer 203 may electrically connect with the conductive layer 101; and interconnections between different layers may be obtained.

The metal layer 203 may be made of any appropriate material, such as Cu, Al, or W, etc. In one embodiment, the metal layer 203 is made of Cu.

A process for forming the metal layer 203 may include forming a metal material layer to fill up the opening 201 and cover the surface of the hard mask layer 202; and planerizing the metal material layer by a chemical mechanical polishing process using the hard mask layer 202 as a stop layer. Thus, the metal layer 203 may be formed; and the surface of the metal layer 203 may level with the surface of the hard mask layer 202.

Various processes may be used to form the metal material layer, such as a CVD process, a PVD process, a sputtering process, or an electro plating process, etc. In one embodiment, the metal material layer is formed by a CVD process, or a sputtering process.

In certain other embodiments, before forming the metal layer 203, a diffusion barrier layer may be formed on the inner surface of the opening 201. The diffusion barrier layer may prevent the metal of the metal layer 203 from diffusing into the dielectric layer 200. If the metal diffuse into the dielectric layer 200, the isolation effect of the dielectric layer 200 may be affected.

The diffusing barrier layer may be made of any appropriate material, such as TiN, or TaN, etc. Various processes may be used to form the diffusion barrier layer, such as a CVD process, a PVD process, or an FCVD process, etc.

Because the conductive layer 101 may not be etched during the process for removing the polymer residues on the inner surface of the opening 201, the surface of the conductive layer 101 may be relatively smooth. Thus, the connection between the metal layer 203 and the conductive layer 101 may be relatively tight; and less numbers of defects may be formed. Therefore, open circuit phenomena and/or other related issues between the metal layer 203 and the conductive layer 101 may be avoided; and the performance of the interconnection structure may be improved.

After forming the metal layer 203, the hard mask layer 202 may be removed. The hard mask layer 202 may be removed by any appropriate process, such as a dry etching process, or a wet etching process, etc.

Thus, a semiconductor structure may be formed by the above disclosed processes and methods; and a corresponding semiconductor structure is illustrated in FIG. 7. The semiconductor structure includes a substrate 100; and a conductive layer 101 formed in a surface of the substrate 100. The semiconductor structure also includes a dielectric layer 200 formed on the surface of the substrate 100; and a metal layer 203 connecting with the conductive layer 101 formed in the dielectric layer 200. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate;
   forming a conductive layer in a surface of the substrate;
   forming a dielectric layer on the surface of the substrate covering the conductive layer;
   forming an opening exposing a portion of the conductive layer in the dielectric layer;
   forming a passivation layer using a passivation solution to react with a surface of the portion of the conductive layer on the bottom of the opening to convert the surface of the conductive layer into a metal complex layer;
   cleaning inner surface of the opening using a cleaning solution not reacting with the passivation layer;
   after cleaning the opening, removing the passivation layer; and
   forming a metal layer connecting with the conductive layer in the opening.

2. The method according claim 1, before forming the metal layer, further including:
   forming a diffusion barrier layer on an inner surface of the trench.

3. The method according to claim 2, wherein:
   the diffusion barrier layer is made of TiN or TaN.

4. The method according to claim 1, wherein:
   the conductive layer is made of Cu.

5. The method according to claim 4, wherein:
   the passivation solution is a 1, 2, 3-benzotriazole (BTAH) water solution, a water solution of a derivative of 1, 2, 3-benzotriazole, or a water solution of 1, 2, 3-benzotriazole and a derivative of 1, 2, 3-benzotriazole;
   a concentration of 1, 2, 3-benzotriazole in the 1, 2, 3-benzotriazole water solution is in a range of approximately 10ppm - 1000ppm;
   a concentration of the derivative of 1, 2, 3-benzotriazole in the water solution of the derivative of 1, 2, 3-benzotriazole is in a range of approximately 10ppm-1000 ppm; and
   a total concentration of 1, 2, 3-benzotriazole and the derivative of 1, 2, 3-benzotriazole in the water solution of 1, 2, 3-benzotriazole and the derivative of 1, 2, 3-benzotriazole is in a range of approximately 10ppm-1000ppm.

6. The method according to claim 5, wherein:
   the 1, 2, 3-benzotriazole derivative includes at least one of 4-methylbenzotriazole, 5-methylbenzotriazole, 5-chlorobenzotriazole and 5-nitrobenzotriazole.

7. The method according to claim 1, wherein:
   the cleaning solution is a mixture solution of amine derivatives and heterocyclic compounds.

8. The method according to claim 7, wherein:
an oxidizing solution is included in the cleaning solution.

9. The method according to claim 1, wherein:
the passivation layer is removed by a low temperature thermal annealing process;
an environment gas of the thermal annealing process is one or more of $N_2$ and $H_2$;
a temperature of the thermal annealing process in a range of approximately 200° C - 400° C.; and
an annealing time is in a range of approximately 30min - 1 hour.

10. The method according to claim 1, wherein:
the dielectric layer is made of low dielectric (low-K) material including one or more of silicon carbide, silicon oxynitride, organic siloxane polymers, or fluorocarbon compounds.

11. The method according to claim 1, wherein forming the opening further includes:
forming a hard mask layer on the dielectric layer;
forming a photoresist layer on the hard mask layer;
patterning the photoresist layer to form an opening; and
etching the hard mask layer using the patterned photoresist layer as an etching mask; and
etching the dielectric layer using the hard mask layer as an etching mask.

12. The method according to claim 11, wherein:
the hard mask layer is made of TiN.

13. The method according to claim 1, wherein:
the metal layer is made of Cu.

14. The method according to claim 1, wherein:
the dielectric layer includes an etching barrier layer.

15. The method according to claim 14, wherein:
the etching barrier layer is made of SiN, SiCN, or SiONCH.

16. A semiconductor structure, comprising:
a substrate;
a conductive layer formed in one surface of the substrate;
a dielectric layer formed on the surface of the semiconductor substrate covering the conductive layer; and
a metal layer electrically connecting with the conductive layer formed in the dielectric layer,
wherein the metal layer is formed by:
    forming an opening exposing a portion of the conductive layer in the dielectric layer;
    forming a passivation layer using a passivation solution to react with a surface of the portion of the conductive layer on the bottom of the opening to convert the surface of the conductive layer into a metal complex layer;
    cleaning inner surface of the opening using a cleaning solution not reacting with the passivation layer;
    after cleaning the opening, removing the passivation layer; and
    forming a metal layer connecting with the conductive layer in the opening.

17. The semiconductor structure according to claim 16, wherein:
the conductive layer is made of Cu; and
the metal layer is made of Cu.

18. The semiconductor structure according to claim 16, wherein:
the passivation solution is a 1, 2, 3-benzotriazole (BTAH) water solution, a water solution of the derivative of 1, 2, 3-benzotriazole, or a water solution of 1, 2, 3-benzotriazole and the derivative of 1, 2, 3-benzotriazole.

19. The semiconductor structure according to claim 16, wherein:
the cleaning solution is a mixture solution of amine derivatives, heterocyclic compounds and $H_2O_2$.

20. The semiconductor structure according to claim 16, wherein:
the passivation layer is removed by a low temperature thermal annealing process;
an environment gas of the thermal annealing process is one or more of $N_2$ and $H_2$;
a temperature of the thermal annealing process in a range of approximately 200° C. - 400° C.; and
an annealing time is in a range of approximately 30min - 1 hour.

* * * * *